United States Patent [19]

Ono

[11] Patent Number: 4,683,183

[45] Date of Patent: Jul. 28, 1987

[54] METHOD OF MANUFACTURING MIM ELEMENTS IN LIQUID CRYSTAL DISPLAYS

[75] Inventor: Yoichi Ono, Shiojiri, Japan

[73] Assignee: Seiko Epson Kabushiki Kaisha, Tokyo, Japan

[21] Appl. No.: 690,226

[22] Filed: Jan. 10, 1985

[30] Foreign Application Priority Data

Jan. 13, 1984 [JP] Japan .................................... 59-4609

[51] Int. Cl.$^4$ ............................................. G02F 1/03
[52] U.S. Cl. ...................................... 430/20; 430/311; 430/313; 430/316; 430/318; 430/319; 350/333; 350/334
[58] Field of Search ................. 430/20, 311, 313, 316, 430/319, 318; 350/333, 334, 339 R

[56] References Cited

U.S. PATENT DOCUMENTS

| 4,523,811 | 6/1985 | Ota | 350/333 |
| 4,534,623 | 8/1985 | Araki | 350/339 R |

FOREIGN PATENT DOCUMENTS

| 57-34520 | 2/1982 | Japan | 350/336 |
| 58-181023 | 10/1983 | Japan | 430/20 |
| 58-184119 | 10/1983 | Japan | 430/20 |

Primary Examiner—John E. Kittle
Assistant Examiner—José G. Dees
Attorney, Agent, or Firm—Blum Kaplan

[57] ABSTRACT

A method of forming a MIM element for use in liquid crystal displays. The MIM element is formed on a substrate using photolithography with a self-alignment method where one of the metal electrodes forming the MIM element acts as a radiation mask to radiation use in forming the element.

27 Claims, 34 Drawing Figures

FIG.1A₁ 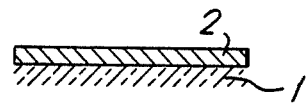
FIG.1A₂ 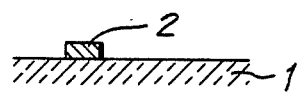
FIG.1A₃ 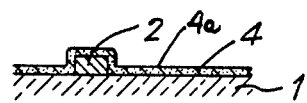
FIG.1A₄ 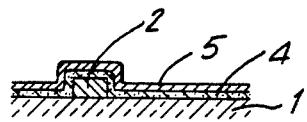
FIG.1A₅ 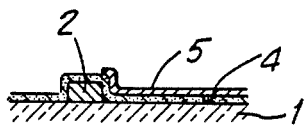
FIG.1A₆ 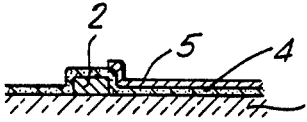

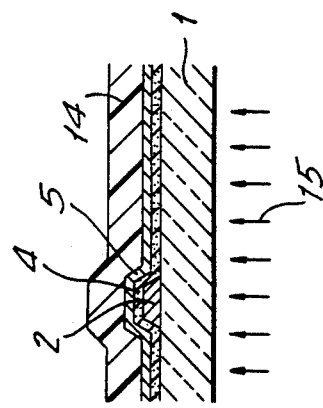
FIG.1B₁
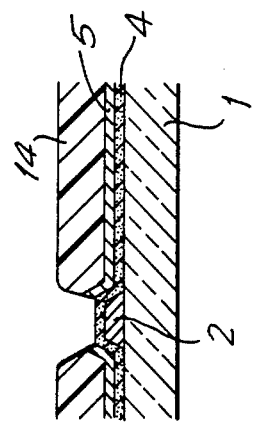
FIG.1B₂
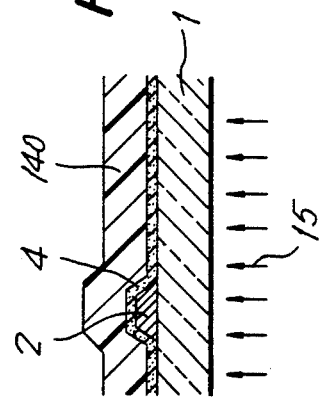
FIG.1C₁
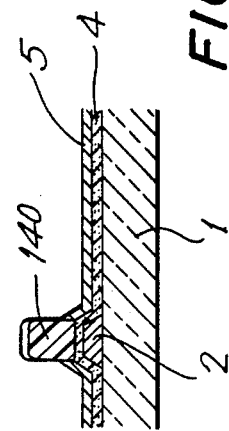
FIG.1C₂

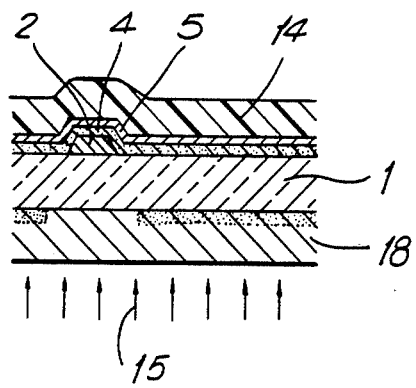
FIG.ID₁
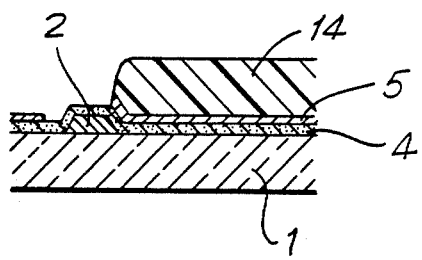
FIG.ID₂
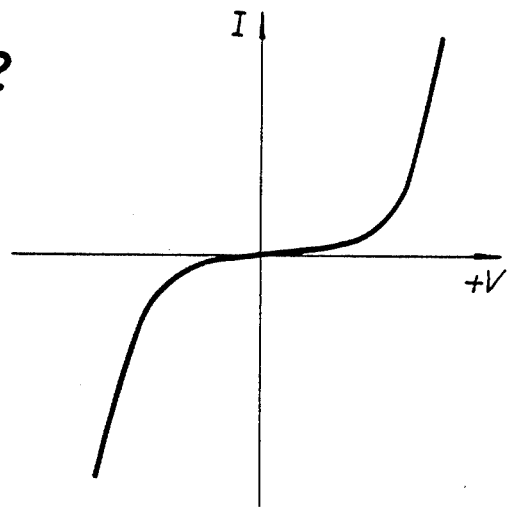
FIG.2

FIG. 10
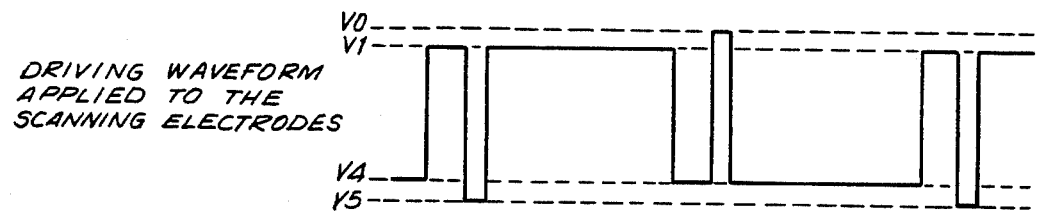
DRIVING WAVEFORM APPLIED TO THE SCANNING ELECTRODES
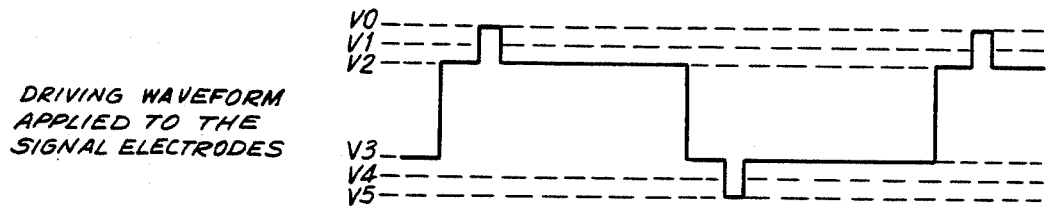
DRIVING WAVEFORM APPLIED TO THE SIGNAL ELECTRODES
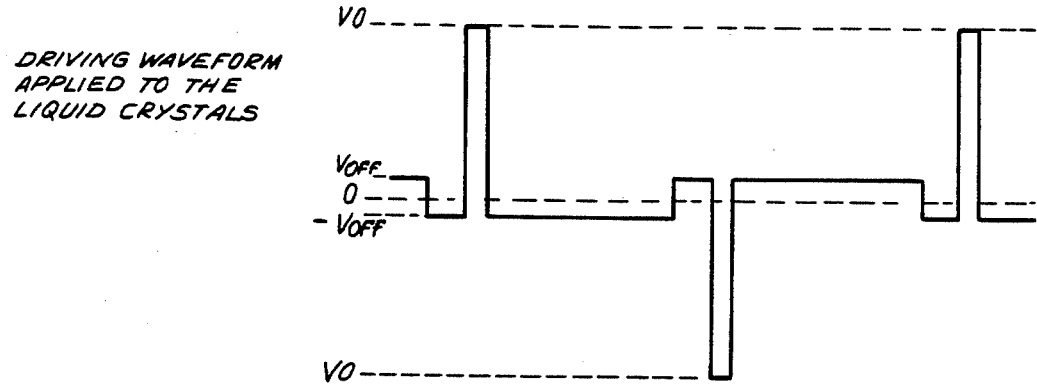
DRIVING WAVEFORM APPLIED TO THE LIQUID CRYSTALS

METHOD OF MANUFACTURING MIM ELEMENTS IN LIQUID CRYSTAL DISPLAYS

BACKGROUND OF THE INVENTION

The present invention is directed to a method of manufacturing a liquid crystal display having a large capacity in which thin film non-linear elements are provided in a substrate of a liquid crystal cell, and which can be driven with a high duty.

A conventional method of manufacturing an electro-optic device incorporating metal-insulator-metal (hereinafter "MIM") elements is described in *Japan Display* '83, PP.404–407, 1983 by S. Morozumi, et al. FIG. 12 of the present application shows a section of one picture element in such a device. A first electrode 32 of the MIM element and an insulator 33 are formed on a substrate 31 and then processed into a predetermined shape. Next, after forming a transparent picture element electrode 36 and processing it into a predetermined shape, an insulator 34 is formed on the side of the first electrode. Subsequently, a second electrode 35 of the MIM element is formed and processed such that it makes electrical contact with the transparent picture element electrode 36.

According to the conventional manufacturing method, however, it was very difficult to achieve non-linear characteristics of the MIM element without degrading display quality of the electro-optic device.

The present invention has been developed to overcome the foregoing disadvantage. The method of the present invention is intended to provide a large capacity liquid crystal display using non-linear elements which are formed by a self-alignment method using a negative type photo resist or by a combination of a self-alignment method using a positive type photo resist and a lift-off method to provide an element superior in non-linear characteristics.

SUMMARY OF THE INVENTION

Generally speaking, in accordance with the present invention, a method of manufacturing a liquid crystal display is provided. The display includes a row electrode formed on either one of two opposed substrates with a liquid crystal material therebetween, a column electrode formed on the other of the two substrates, and a MIM (Metal-Insulator-Metal) element coupled to each of the picture elements defined where the row and column electrodes overlap on at least one of the electrodes. The process of forming the MIM element is a photolithography process using a self-alignment method in which the substrate is exposed from behind with radiation with a first electrode of the MIM element as a radiation mask.

The process of forming a second electrode of the MIM element may be of either a photolithography process using a self-alignment method in which a negative type photo resist is coated on the second electrode with the substrate being exposed from behind with the first electrode of the MIM element as a mask, or a lift-off method in which a positive type photo resist is coated on the insulator.

The insulator may be formed on the first electorde in substantially the same pattern as the first electrode, or may be formed over substantially the entire surface of the substrate having the MIM elements formed thereon, except for the electrical connecting terminal portion of the substrate where coupled to an external control circuit of the liquid crystal display.

A transparent electrode is formed on the second electrode to serve as a picture element electrode for displaying characters, figures and the like. As an alternative, the second electrode may itself be transparent to serve also as a picture element electrode directly.

When forming the second electrode using a self-alignment method in accordance with the present invention, a process may be used where a photo mask is disposed on the rear surface of the substrate on which the MIM elements are to be formed, and exposure is then carried out from the rear of the substrate.

The first electrode, insulator and the second electrode are preferably formed in a laminated configuration. To this end, the present invention provides either a method in which the first electrode is formed on the surface of the electrode substrate, and the insulator and the second electrode are formed thereon in this order in a laminated configuration, or a method in which the second electrode is formed on the surface of the electrode substrate, and the insulator and the first electrode are formed thereon in this order. In the former method, a self-alignment method is used with the first electrode as a reference when forming the second electrode, whereas in the latter method, a self-alignment is used with the second electrode as a reference when forming the first electrode.

Accordingly, it is an object of the present invention to provide an improved method of manufacturing MIM elements.

Another object of the present invention is to provide an improved method of manufacturing a liquid crystal display having MIM elements.

A further object of the present invention is to provide an improved method of manufacturing MIM elements in a liquid crystal display having a large capacity which can be driven with a high duty.

A still further object of the present invention is to provide a liquid crystal display having MIM elements manufactured in an improved process.

Still other objects and advantages of the invention will in part be obvious and will in part be apparent from the specification.

The invention accordingly comprises the several steps and the relation of one of more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. $1A_1$ through $1D_2$ are schematic views for explaining a method of manufacturing an electro-optic device with MIM elements in accordance with the present invention;

FIG. 2 is a graph showing the non-linear characteristics of the MIM elements obtained by the manufacturing method of the present invention;

FIG. 10 is a waveform chart for explaining operation of the device;

DESCRIPTION OF THE PREFERRED EMBODIMENTS

Figure 3A:
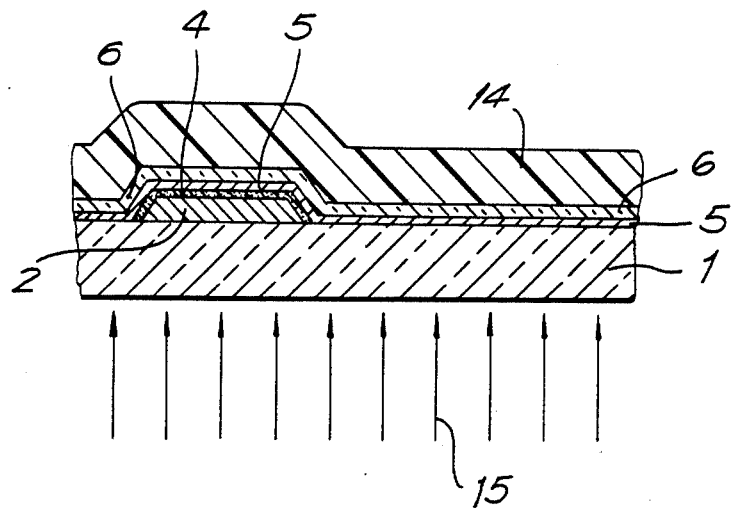
FIGS. 3A and 3C are explanatory views for explaining another embodiment of the manufacturing method of the present invention.

A manufacturing method of an electro-optic device using nonlinear elements in accordance with the present invention will now be described with refgerence to FIGS. $1A_1$ through $1D_2$. FIGS. $1A_1$ through $1A_6$ are views for explaining an outline of the manufacturing method in accordance with the present invention, and FIGS. $1B_1$ through $1D_2$ are views for explaining the essential processes thereof.

According to the manufacturing method of the present invention, a first electrode metal film 2 is formed on a glass substrate 1 (FIG. $1A_1$) and a given pattern is then defined with photo etching (FIG. $1A_2$). Next, an insulator 4 constituting a second layer is formed over the entire surface of metal film 2 except for a terminal portion thereof by any suitable method such as by mask sputtering, mask evaporation, or mask CVD (FIG. $1A_3$). Insulator 4 is formed of an insulating film 4a which has such a high density that is includes no pin holes and which has a uniform film thickness of about 100 Å–1000 Å.

Subsequently, an ITO film 5 serving also as a picture element is formed over insulator 4 by magnetron sputtering (FIG. $1A_4$) and the desired pattern is obtained by photo-etching using a self-alignment method in which substrate 1 is exposured from behind by employing a negative type photo resist with the first electrode metal film 2 as a mask (FIG. $1A_5$). Finally, a photolithography process is performed on substrate 1 once again to process picture element electrode 5 into the desired form (FIG. $1A_6$).

The detailed process of the self-alignment method is shown by FIGS. $1B_1$ and $1B_2$ in which reference numeral 14 designates a negative type photo resist and 15 designates ultraviolet rays (h·ν).

It is noted that the third thin film (or the second electrode) serving also as the picture element electrode may be likewise formed by a lift-off method using a positive type photo resist. This process is shown in detail by FIGS. $1C_1$ and $1C_2$ wherein reference numeral 140 designates a positive type photo resist. In this case, the sequence of forming the third thin film (or the second electrode) is reversed in comparison with the foregoing method using the negative type photo resist 14, but the same result is eventually obtained. In the process of forming the third thin layer using a self-alignment method, it is also possible to carry out exposure with a photo mask 18 for a pattern of the picture element electrode 5 being disposed on the rear surface of substrate 1, as shown in FIGS. $1D_1$ and $1D_2$. This enables reduction in the number of steps of the photolithography process, since picture element electrode 5 can be formed simultaneously with the non-linear element.

It should be understood that the greatest advantage resulting from forming the third thin film using a self-alignment method is in making it possible to stably manufacture elements superior in non-linear characteristics without the need of fine alignment during the photolithography process. This is attributable to the fact that the non-linear element is formed on the side portion of the first thin film layer, and the element size is automatically determined by a thickness of the first thin film only with a pattern of the third thin film being formed constant. According to the present invention, therefore, non-linear characteristics can be improved and stabilized and the manufacturing process can be simplified as compared with the prior art. Furthermore, use of the self-alignment method is advantageous in that there is no need of a fine photolithography technique. There is also simplified element configuration, thus resulting in high yield, lower cost and high reliability.

Operation of a non-linear element thus manufactured will now be described by referring to the case where it is applied to a liquid crystal display. The non-linear element has a resistance value which varies depending on voltage as shown in FIG. 2, thus providing non-linear characteristics with a current not in conformity with Ohm's law. Accordingly, when a driving signal applied to a liquid crystal panel is in such a state where the current flows through the non-linear element, i.e., in an ON state, the electric field is applied to the crystal liquid layer to be lit up. When the driving signal is in such a state where little current flows through the non-linear element, i.e., in an OFF state, the electric field applied to the liquid crystal layer is so small that it will not be lit up.

Use of such non-linear characteristics makes it possible to significantly improve dynamic driving characteristics of the liquid crystal panel. More specifically, while the normalliquid crystal panel is operated at a duty as much as about 1/64, the present liquid crystal display incorporating the non-linear elements manufactured as described above can be operated at duty of 1/500 or less and has a greatly improved display quality. Specific examples will now be described.

EXAMPLE 1

Figure 3B:
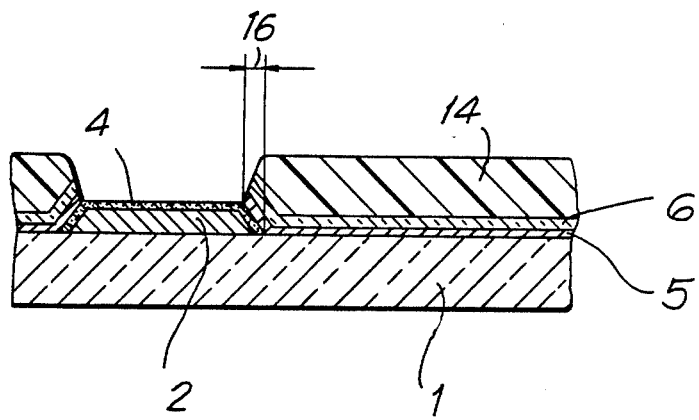
Figure 3C:
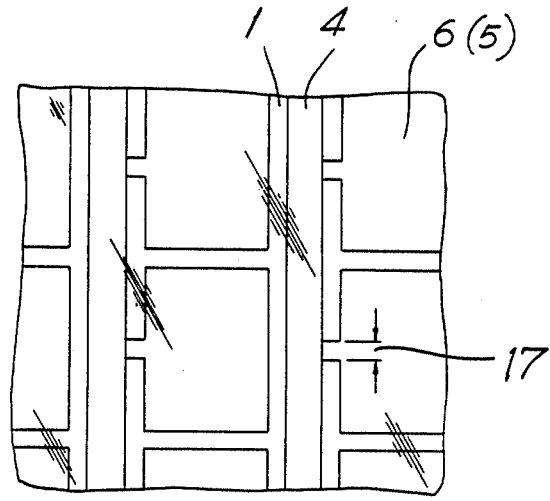

FIGS. 3A and 3B show the process in accordance with the present invention, and FIG. 3C shows a partial plan view of a group of MIM elements in accordance with the above process.

As shown in FIG. 3A, a first electrode 2 of each MIM element is formed on a substrate 1 and then processed into a predetermined shape. Next, an insulator 4 of the MIM element is formed on the surface of the first electrode 2 thereof. Subsequently, a second electrode 5 of the MIM element and a transparent element 6 are formed thereon in this order. It is to be noted that a film thickness of the second electrode 5 of the MIM element is selected to be less than 200 Å. Thereafter, a negative type photo resist 14 is formed and a self-alignment method is carried out in which the substrate is exposed from behind, as depicted, using ultraviolet rays 15, with the first electrode 2 of the MIM element acting as a mask. The first electrode 2 of the MIM element is generally formed of metals such as Al or Ta, s the ultraviolet rays 15 will not transmit therethrough. The second electrode 5 is also generally formed of metals such as Al, Ta or Cr but has a film thickness less than 200 Å, so the ultraviolet rays 15 transmit therethrough. The transparent electrode 6 is transparent, so the ultraviolet rays transmit therethrough. As a result, the front side of the substrate except for the part masked by the metal forming the first electrode 2 of the MIM element, is exposed to the ultraviolet rays 15. Thereafter, the negative photo resist 14 is developed and both the transparent electrode 6 and the second electrode 5 of the MIM element are removed, thus resulting in the state as shown in FIG. 3B. In other words, the second electrode 5 of the MIM element and the transparent electrode 6 are both left only at a side face portion 16 of the first electrode 2 of the MIM element, on the front of which is formed the insulator 4 of the MIM element. Next, the negative photo resist 14 is removed and both the second electrode 5 of the MIM element and the transparent electrode 6 are processed into a predetermined shape as shown in FIG. 3C. At this time, the picture element area of the electro-optic device and the length 17 of each MIM element are determined.

Figure 4:
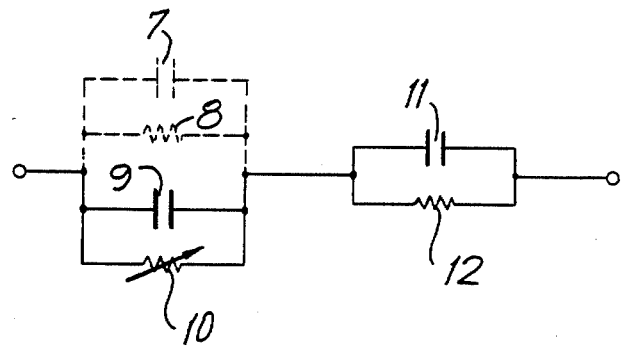
FIG. 4 is a schematic circuit diagram for explaining the characteristics of the electro-optic device obtained by the manufacturing method of the present invention in the form of an equivalent circuit.

Operation of the MIM element thus manufactured will now be described by referring to FIG. 4. FIG. 4 shows an equivalent circuit (solid lines) of one picture element of the electro-optic device incorporating the MIM elements of the present invention in comparison with an equivalent circuit (combination of solid lines and broken lines) for a conventional device. Insulator 4 would include a static capacitance and a resistance 8. The MIM element includes a static capacitance 9 and a non-linear resistance 10. Further the liquid crystal layer includes a static capacitance 11 and a resistance 12.

When driving the liquid crystal layer with the MIM element, it is required that the non-linear resistance 10 of the MIM element have good non-linear characteristics, and that the static capacitance 9 of the MIM element be sufficiently smaller than the static capacitance 11 of the liquid crystal layer. In the conventional MIM element, the static capacitance 7 of the insulator 4 is coupled in parallel to the static capacitance 9 of the MIM element. Stated differently, the equivalent capacitance of the MIM element is increased and cannot be made sufficiently small as compared with the static capacitance of the liquid crystal layer, thus degrading a display quality of the electro-optic device. Also, the resistance 8 of the insulator 4 is coupled in parallel to the non-linear resistance 10 of the MIM element.

The non-linear resistance 10 of the MIM element has a tendency to increase its resistance when lower voltage is applied thereto and to lower its resistance when higher voltage is applied thereto. With the resistance 8 of the insulator 4 being coupled in parallel, therefore, the resistance value of the MIM element becomes small when lower voltage is applied thereto, and this degrades a display quality of the device.

On the other hand, according to the present invention, there exists no static capacitance coupled to the MIM element in parallel. More specifically, the static capacitance serially coupled to the static capacitance 11 of the liquid crystal layer is only the static capacitance 9 of the MIM element. The static capacitance 9 of the MIM element can be made sufficiently small as compared with the static capacitance 11 of the liquid crystal layer, thereby making it possible to improve a display quality of the electro-optic device. Also, there exists no resistance coupled to the MIM element in parallel. On this account, it becomes possible to effectively utilize such a feature of the MIM element that it has high resistance when lower voltage is applied to the non-linear resistance and has low resistance when higher voltage is applied thereto. Further, since the second electrode 5 of the MIM element and the transparent electrode 6 are both present only at the side surface of the first electrode 2 of the MIM element on which the insulator 4 of the MIM element has been formed, there can be obtained a MIM element superior in non-linear characteristics without the need of a fine photolithography technique.

EXAMPLE 2

Figure 5A:
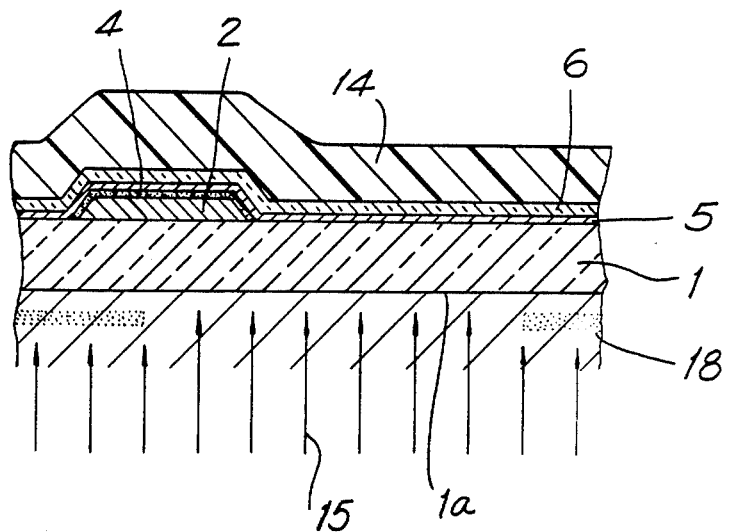
FIGS. 5A and 5B depict another embodiment of the manufacturing method of the present invention.
Figure 5B:
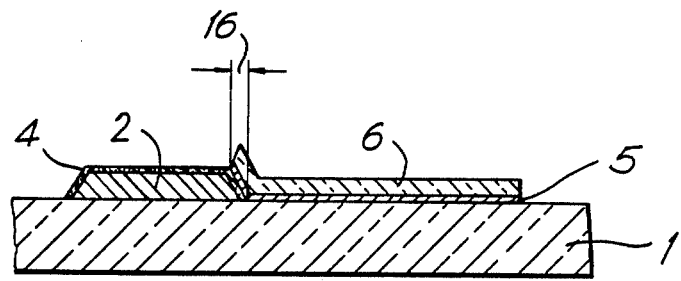

FIG. 5A shows the main process of another embodiment in accordance with the present invention, and FIG. 5B shows a section of a MIM element manufactured with this process. The steps of forming the second electrode 5 of the MIM element, the transparent electrode 6 and the negative type photo resist 14 are the same as those in Example 1. The difference from Example 1 is in combined use of a photo mask in the self-alignment method. More specifically, as shown in FIG. 5A, a photo mask 18 is disposed on the rear surface 1a of substrate 1 and ultraviolet rays 15 are exposed from behind. Next, the negative type photo resist 14 is developed and both the transparent electrode 6 and the second electrode 5 of the MIM element are removed, thus resulting in a structure as shown in FIG. 5B. In other words, the MIM element is formed at the side face portion 16 of the first electrode 2 of the MIM element on which is formed the insulator 4 of the MIM element, and the picture element area of the electro-optic device and the length 17 (FIG. 3C) of the MIM element are both determined. Namely, it requires just one process to determine the picture element area of the electro-optic device and the length of the MIM element. As a result of intensive testing conducted by the present inventor, the above process was realized by using a projection aligner as a practical exposure unit and carrying out alignment exposure with the focus being adjusted to the front surface of the substrate.

EXAMPLE 3

To form the first metal film layer: Al was vapor-deposited on a Pyrex glass substrate by an EB evaporation method to have a film thickness of about 2000 Å. Next, to obtain a given pattern of the first layer, a positive type photo resist was coated on the Al film and it was subjected to the normal photolighography process. A PNC solution (mixture solution of phosphoric acid, nitric acid and acetic acid) was used for etching Al.

To form the second insulating film layer: Magnetron sputtering $SiO_2$ was carried out with the terminal portion of the first layer pattern being masked by a metal foil, to obtain a dense and uniform film of about 500 Å.

To form the third ITO film layer: Reactive sputtering with magnetron DC sputtering was carried out over the entire surface of the substrate to form an ITO film of about 300 Å thickness. Next, a negative type photo resist was coated by a spinner to be 1.5 μm thick and a self-alignment method was carried out such that the substrate was exposed from the rear side thereof with the first Al layer pattern as a mask, to form an overlapping portion of the nonlinear element. Finally, a positive type photo resist was once again coated in a similar manner and each picture element electrode was obtained with the normal photolithography process.

The electrode substrate thus fabricated was used as one of electrode substrates for holding a liquid crystal material therebetween. The above electrode was used as a column (or row) electrode, a row (or column) electrode was formed on the other electrode substrate and it was driven by a voltage averaging method. As a result, there were obtained a satisfactory contrast and a wide visual angle even at a duty of 1/500 with V−4V driving in which Vo voltage is applied at non-selection of time sharing driving and 4Vo voltage is applied at selection thereof.

EXAMPLE 4

First metal film layer: Ni
Second insulating film layer: $SiO_2$
Third metal film layer: Al.

The above materials were used for the respective layers, and a non-linear element was fabricated in a similar manner to Example 1 (the first metal film layer, Al is formed thereon with magnetron DC sputtering) and the same result as that of Example 1 was obtained.

EXAMPLE 5

First metal film layer: Cr
Second insulating film layer: $Cr_2O_3$
Third film layer: ITO.

The above materials were used for the respective layers, the films of Cr and $Cr_2O_3$ were formed with continuous magnetron RF sputtering under the same vacuum, and the self-alignment method was carried out to obtain a non-linear element. This non-linear element was used to form a TN type liquid crystal cell which was then driven in a time sharing manner. As a consequence, there was obtained the same result as that of Example 3.

EXAMPLE 6

First metal film layer: Ta of 4000 Å thickness
Second insulating film layer: $Ta_2O_5$ of 500 Å thickness
Third metal film layer: Cr of 4000 Å thickness.

A non-linear element was fabricated in a similar manner to Example 5 and the same result as that of Example 3 was obtained.

EXAMPLE 7

First metal film layer: Ta
Second insulating film layer: $SiO_2$
Third film: ITO.

The above materials were used for the respective layers, the films of Ta and $SiO_2$ were formed with continuous magnetron RF sputtering under the same vacuum, and a non-linear element was manufactured by a method in which a photo mask for the picture element electrode was disposed on the rear surface of the substrate at the time of forming the third thin film layer, serving also as a transparent picture element electrode, with a self-alignment method, while simplifying the process. This non-linear element was used to form a TN type liquid crystal cell which was then driven in a time sharing manner. As a consequence, there was obtained the same result as that of Example 3.

FIGS. 6A through 6F show alternative embodiments of the manufacturing method of the electro-optic device in accordance with the present invention.

Figure 6A:
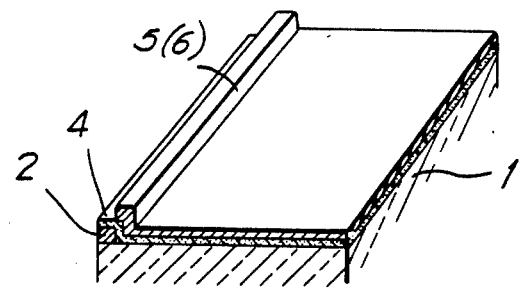
FIGS. 6A and 6F depict various types of electro-optic devices to which the manufacturing method of the present invention can be applied.

More specifically, as shown in FIG. 6A, the electro-optic device of the present inventio may be manufactured such that the second electrode 6 of the MIM element is formed along the first electrode thereof.

Figure 6B:
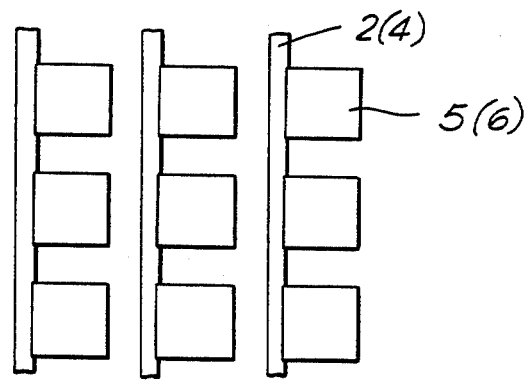
Figure 6C:
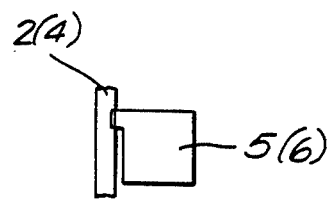

When viewed from above, the electrodes of the MIM element may be arranged as shown in FIGS. 6B and 6C in place of the arrangement as shown in FIG. 3C.

Figure 6D:
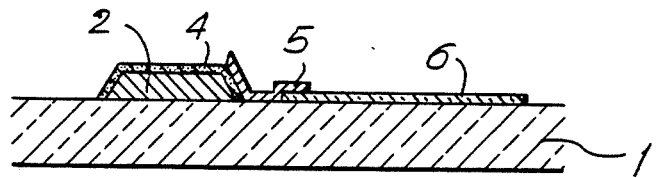
Figure 6E:
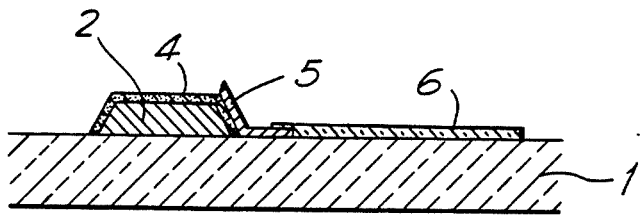
Figure 6F:
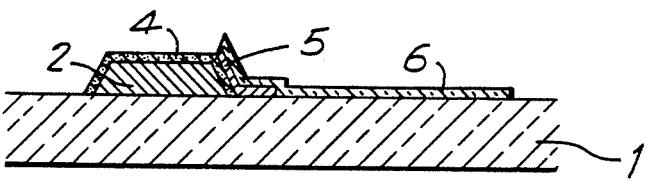

In any case, the electrodes constituting the MIM structure may be arranged into such configurations as shown in FIGS. 6D, 6E and 6F in which a part of the second electrode 5 overlaps the transparent electrode 6.

Figure 7:
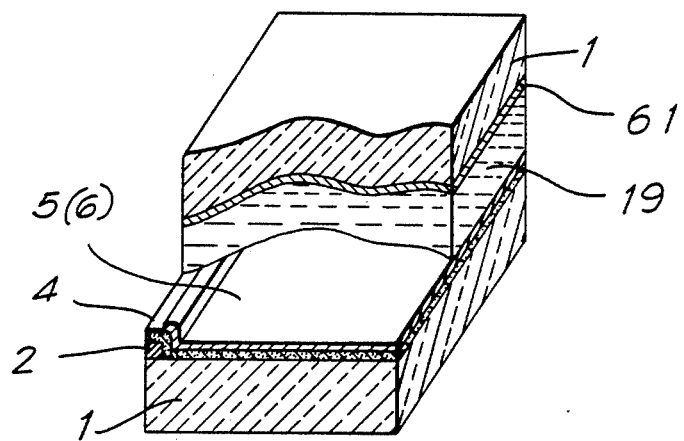
FIG. 7 is a cut-away view of an embodiment of the electro-optic device constructed in accordance with the manufacturing method of the present invention.

FIG. 7 shows an embodiment of a liquid crystal display in which the electrode substrate having the MIM structure as shown in FIG. 6A is used as one of the electrode substrates for holding a liquid crystal material 19 therebetween.

EXAMPLE 8

Figure 8:
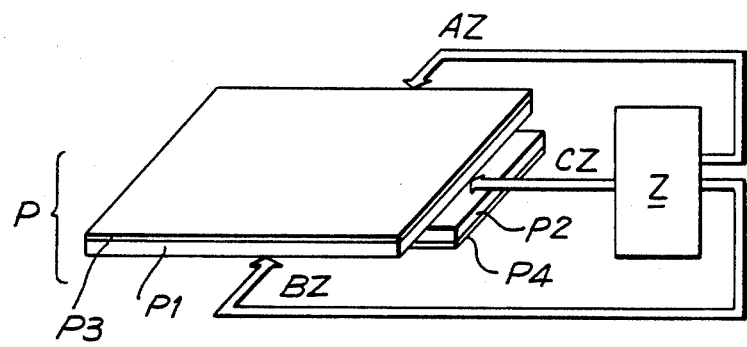
FIG. 8 is a schematic view for explaining a liquid crystal display fabricated by the manufacturing method of the present invention.

A liquid crystal display was structured as shown in FIG. 8. A liquid crystal display body P includes substrates $P_1$, $P_2$ holding a liquid crystal material therebetween, and polarizers $P_3$, $P_4$ arranged on the upper and lower surfaces thereof. Driving voltages as shown in FIG. 10 were applied to the electrode on the scanning side and the electrode on the signal side from a driving circuit Z, respectively.

Hereinafter, operation of the liquid crystal display according to the present invention will be described in detail by referring to the illustrated embodiment.

Figure 9:
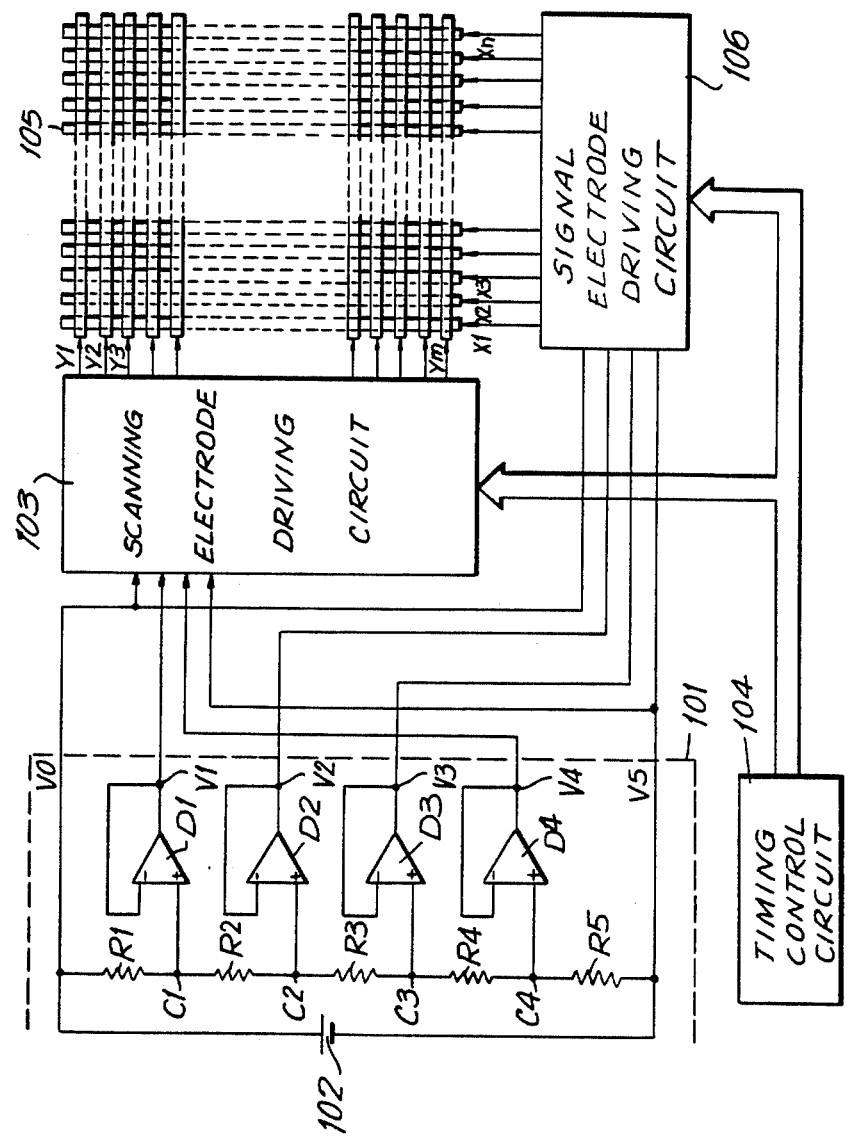
FIG. 9 is a block circuit diagram of a circuit showing an example of a device embodying the present invention.

FIG. 9 is a block diagram of a circuit showing one example of a display embodying the present invention. The circuit includes a liquid crystal driving voltage generating circuit 101 which is so arranged that five voltage dividing resistors R1, R2, R3, R4 and R5 are serially coupled to a voltage source 102 for outputting voltage Eo to bring each picture element into an ON state, and an impedance converter is coupled which includes operational amplifiers D1, D2, D3 and D4 having their one input terminals coupled to joints C1, C2, C3 and C4 between the resistors R1, R2, R3, R4 and R5 and having their other input terminals coupled to their output terminals, thereby dividing the voltage Eo into the following voltages to be output, respectively:

$$V0 = Eo$$
$$V1 = (1 - 1/K(\sqrt{N} + 1))Eo$$
$$V2 = (1 - 2/(\sqrt{N} + 1))Eo$$
$$V3 = (2/(\sqrt{N} + 1))Eo$$
$$V4 = (1/K(\sqrt{N} + 1))Eo$$
$$V5 = 0$$

where N is the number of scanning lines. The constant K is a value larger than 1 which is varied depending on the matrix liquid crystal panel used.

A scanning electrode driving circuit 103 is so arranged to receive driving voltages V0, V1, and V4 from the liquid crystal driving voltage generating circuit 101 and a signal from a timing control circuit 104, and to scan in sequence scanning electrodes Y1, Y2 ... Ym of a matrix type liquid crystal display panel 105 with the signal from the timing control circuit. A signal electrode driving circuit 106 is so arranged to receive voltages V0, V2, V3 from the liquid crystal driving voltage generating circuit 101 and a signal from the timing control circuit 104, and to scan in sequence signal electrodes X1, X2 . . . Xn at the given voltage with the signal from the timing control circuit 104.

Operation of the display thus arranged will now be described by referring the waveforms shown in FIG. 10.

When a video signal is input to the timing control circuit 104, the driving voltages are supplied from the scanning electrode driving circuit 103 to the individual scanning electrodes Y1, Y2 . . . Ym in accordance with synchronizing signals in the input signal (I), so that the voltages V5, V0 are applied to the selected scanning electrodes and the voltages V4, V1 are applied to the non-selected scanning electrodes. On the other hand, the driving voltages are supplied from the signal electrode driving circuit 106 to the individual signal electrodes (II), thus applying the voltages V0, V5 to the selected signal electrodes and the voltages V2, V3 to the non-selected signal electrodes, so that those signal electrodes are scanned in sequence. At this time, the alternating voltage having an effective value of $|V2 - V1|, |V3 - V4|$, that is:

$((2K - 1)/K(\sqrt{N} + 1)) Eo =$ $(2 - 1/K) \times 1/(\sqrt{N} + 1) Eo \, 1/(\sqrt{N} + 1) Eo$ is applied to the non-selected picture elements. It is to be noted that the driving signals applied to the liquid crystal panel, i.e., driving waveform applied to the scanning electrodes, driving waveform applied to the signal electrodes as well as driving waveform applied to the liquid crystals, are configured as shown in FIG. 10.

On this account, the panel screen displays thereon an image in which each picture element is driven with a contrast corresponding to that instructed by the video signal in ratio of 1 to 1, and which is duly ordered in gradation.

The electro-optic device manufactured by the method of the present invention was able to provide a satisfactory contrast ratio, even when the value of N was selected much smaller than the number of scanning lines.

In case of driving at 1/500, for example, there was obtained the satisfactory contrast ratio even with the value of N set to 16 in place of 500, the value of K set to 1 and use of V−5V driving voltage (i.e., voltage averaging method in which 5Vo voltage is applied when selected and Vo voltage is applied when nonselected).

EXAMPLE 9

Figure 11A:
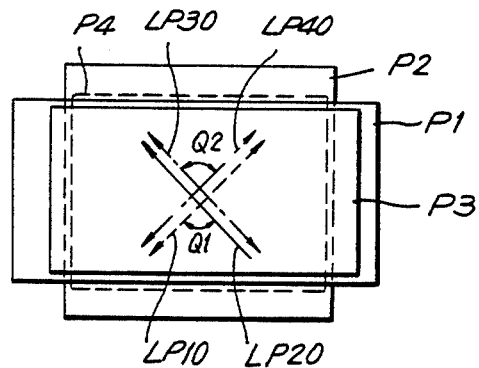
FIGS. 11A through 11D show various embodiments of a liquid crystal body constituting the liquid crystal display of the present invention.

A liquid crystal display body constituting the liquid crystal display of the present invention was structured as shown in FIGS. 11A through 11D. FIG. 11A shows an embodiment where a direction of LP10 of orientation treatment of an upper substrate P1 (orientation treatment was carried out by rubbing) is set in the direction of the corresponding arrow, a directio LP20 of orientation treatment of a lower substrate P2 is set in the direction of the corresponding arrow, and a crossing angle θ1 therebetween is set to 90°. A direction LP30 of polarizing axis of the upper polarizer P3 (the polarizing axis is perpendicular to the absorbing axis) is in parallel to the direction LP20 of orientation treatment, and a direction LP40 of polarizing axis of the lower polarizer P4 is in parallel to the directio LP10 of orientation treatment.

Figure 11B:
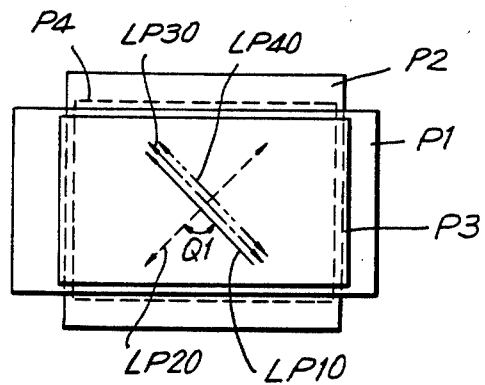

FIG. 11B shows another embodiment that the crossing angle θ1 between the directions of orientation treatment is set from 80° to 100°, and the polarizing axes LP30, LP40 are both in parallel to the direction LP10 of orientation treatment.

Figure 11C:
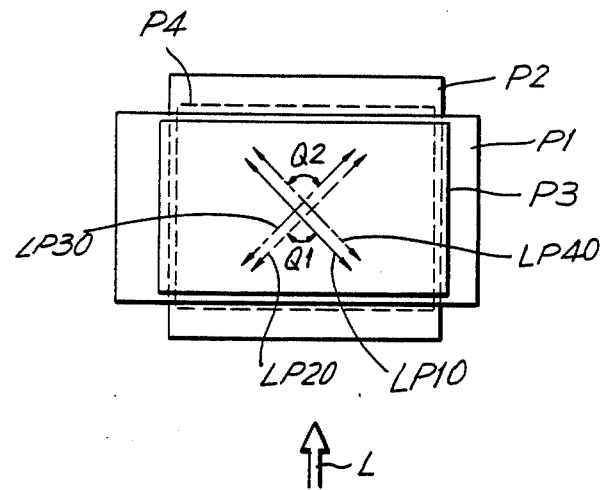

Furthermore, FIG. 11C shows still another embodiment where the crossing angle θ1 between the directions of orientation treatment and a crossing angle θ2 between the polarizing axes are both set from 80° to 100°, the direction LP40 of polarizing axis is substantially in parallel to the direction LP10 of orientation treatment, and the direction LP30 of polarizing axis is substantially in parallel to the direction LP20 of orientation treatment.

Figure 11D:
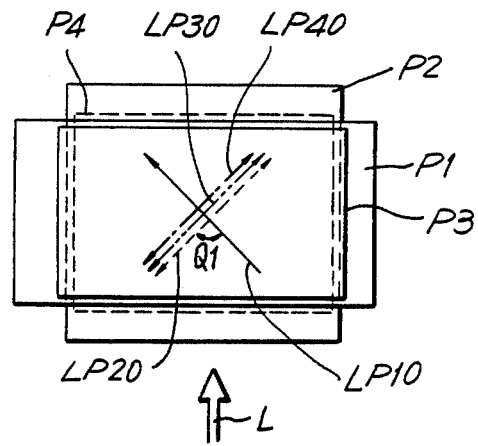
Figure 12:
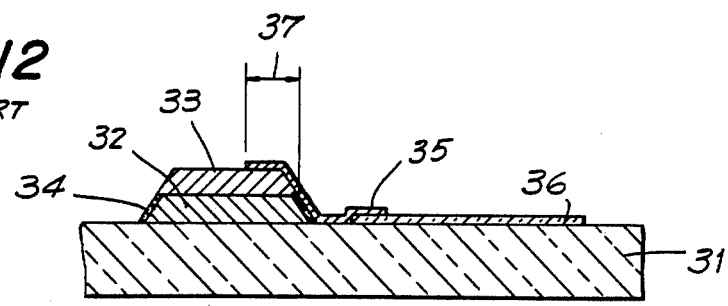
FIG. 12 is a view for explaining a manufacturing method in accordance with the prior art.

FIG. 11D shows still another embodiment where the crossing angle θ1 between the directios LP10 and LP20 of orientation treatment is set from 80° to 100°, and the polarizing axes LP30, LP40 are both substantially in parallel to the direction LP20 of orientation treatment.

The viewing direction of these display bodies is one from below to above as indicated by arrow L.

It is also possible to manufacture the display body in such a manner that the direction LP10 of orientation treatment of the upper substrate P1 is reversed relative to the direction LP20 of orientation treatment shown in FIGS. 11A through 11D, the direction LP20 of orientation treatment of the lower substrate P2 is reversed relative to the direction LP10 or orientation treatment shown in FIGS. 11A through 11D, and the polarizing axes of the upper and lower axes P2, P3 are aligned with the directions or orientation similar to FIGS. 11A through 11D, with the viewing direction being set to be one from below to above.

EXAMPLE 10

A liquid crystal display was fabricated by laminating a reflector onto the lower polarizer P4 of the liquid crystal display body P shown in FIG. 8.

EXAMPLE 11

A liquid crystal display of transmission type was fabricated by irradicating a back light to the liquid crystal display body P shown in FIG. 8 from below.

A beam of radiation exposed from the rear of the substrate for the self-alignment is preferably ultraviolet radiation, buy may be of infrared radiation, visible radiation, an electron beam or a laser beam.

In the MIM-type electro-optic device, the smaller the capacitance $C_{MIM}$ of a non-linear element is in comparison with the capacitance $C_{LC}$ of a liquid crystal layer on the picture element electrode, the more effectively the driving voltage is applied to the non-linear element. The ratio of $C_{LC}/C_{MIM}$ is required to be larger than 1, preferably above 3 and ideally above 8–10. According to the manufacturing method of the present invention, it is easy to achieve the value of $C_{LC}/C_{MIM}$ larger than 1 and this imposes good influence upon utilization of non-linear characteristics.

It is to be noted that, in the present invention, the electrode referred to as a first electrode indicates the metal electrode on the terminal electrode side out of the MIM electrodes, and the metal electrode on the picture element side is referred to as a second electrode.

An electrode substrate material may be of glass, plastic or any other materials which have a sufficient transmission factor. In case the liquid crystal display according to the manufacturing method of the present invention is used as a reflection type, an insulating layer may be formed on a thin metal sheet having a good reflection characteristic to thereby provide an electrode substrate.

In case of a self-alignment method with the first electrode as a reference electrode, a first electrode material may be of any metal, but preferably Al, Ni, Cr or Ta in order to achieve non-linear characteristics. A thickness of the first electrode is preferably in the range of about 1000 Å–1μ. In the case of Al, a thickness of about 2000 Å is preferable and, in the case of Ta, a range of 3000 Å–6000 Å is preferable.

A second electrode material in case of forming the second electrode with the first electrode as a reference electrode using a self-alignment method, may be of almost any metals such as Cr, Al or Nichrome. As an alternative, alloys such as NiCr may be also used. A thickness of the metal used is preferably less than 200 Å, more preferably less than 100 Å, in order to effectively transmit a beam of radiation for exposure. A more thin metal layer is preferable, but it becomes hard to form a continuous film when it is extremely thin. According to the latest technology, a lower limit of thickness is about 10 Å. In practice, a thickness of 40–60 Å is preferable.

In case of forming the first electrode on the second electrode by a self-alignment method with the latter as a reference electrode, the above-mentioned first and second electrodes may be reversed in their constructions such that the first electrode film is formed to be thin enough to effectively transmit a beam of radiation for exposure.

The second electrode is further electrically coupled to a picture element electrode. The second electrode and the picture element electrode may be electrically coupled to each other, so that both electrodes may be overlapped in a laminated form just at the portions thereof, or the entire picture element portion may be structured such that the picture element electrode is completely eliminated over the second electrode. As an alternative, the second electrode may serve also as a picture element electrode directly. In this case, the second electrode may be formed of ITO, $SnO_2$, ZnO, or other materials which have a sufficient transmission factor. In case of using ITO, a preferable thickness is from 100 Å–2000 Å, more preferably from 200 Å–800 Å. This also applies in the case of $SnO_2$. Of course, the second electrode and the picture element electrode may be structured as separate elements from each other. The mixture of indium oxide and tin oxide may be used as ITO.

The insulator may be of metal oxides such as $SiO_2$, $Cr_2O_5$, $Ta_2O_5$, and the like.

As an example, the first electrode of the MIM element may be of Ta, the second electrode may be of $Ta_2O_5$, and the insulator may be of Cr. In this case, it is preferable that Ta has a thickness of 3000–5000 Å, that $TA_2O_5$ has a thickness of 300–600 Å and that Cr have a thickness of 600–800 Å.

Furthermore, a lead electrode coupling the first electrodes of the MIM elements is preferably formed of a metal film having low resistance. As an alternative, the first electrode may serve also as a lead electrode.

As fully described herein, according to the present invention, since a negative or positive type photo resist is employed and a self-alignment method is carried out in which the substrate is exposed from the rear side, with the first thin layer of a non-linear element as a mask, it becomes possible to eliminate the need of a fine photolithography technique, to obtain a non-linear element superior in non-linear characteristics since the element is formed just at the side face portion of the first thin film layer, and to provide a liquid crystal display of large capacity which has a good display quality.

The number of steps necessary for the photolithography can be reduced with combined use of a photo mask in the above self-alignment method. Further, the number of steps necessary to form the thin film can be also reduced by forming both the second insulating film layer and the third thin film layer of the non-linear element in the same vacuum, and by arranging the third thin film layer to serve also as a transparent picture element electrode. As a result, it becomes possible to remarkably simplify the manufacturing process, achieve can improved yield and lower the cost, thus providing a less expensive liquid crystal display of large capacity.

Consequently, the present invention is particularly effective in a liquid crystal display used for computer terminals and personal computers which require a large screen display of large capacity.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of forming a MIM element having a first metal electrode and a second metal electrode with an insulator therebetween in an electro-optic display device having first and second opposed substrates with a liquid crystal material disposed therebetween, said first substrate having at least a first row electrode formed thereon, said second substrate having at least a first column electrode formed thereon, a picture element being defined where said row and column electrodes overlap in top plan view, comprising the step of forming said MIM element having first and second electrodes with an insulator therebetween at the position where said picture element is defined on one of said first and second substrates by a photolithography process using a self-alignment method where the substrate on which said MIM element is formed is exposed from behind with radiation with said first metal electrode acting as a mask.

2. The method as claimed in claim 1, wherein said second metal electrode is formed by a photolithography process using a self-alignment method in which a negative-type photo resist is coated on said second metal electrode, said substrate on which said MIM element is formed being exposed from behind with radiation with said first metal electrode acting as a mask.

3. The method as claimed in claim 1, wherein said insulator is formed on said first metal electrode.

4. The method as claimed in claim 1, wherein said insulator is formed substantially over the entire surface of the substrate on which said MIM element is formed.

5. The method as claimed in claim 1, wherein said second metal electrode includes a transparent electrode as a picture element electrode formed thereon.

6. The method as claimed in claim 1, wherein said second metal electrode is transparent to serve as a picture element electrode.

7. The method as claimed in claim 1, wherein said second metal electrode is formed using a self-alignment method with a photo mask being disposed on the rear surface of the substrate on which said MIM element is formed.

8. The method as claimed in claim 1, wherein said second metal electrode is formed by a photolithography process using a self-alignment method, said substrate on which said MIM element is formed being exposed from behind with radiation with said first metal electrode acting as a mask through said insulator.

9. The method as claimed in claim 1, wherein said first electrode includes a side face portion, said MIM element being formed at said side face portion by a self-alignment method.

10. The method as claimed in claim 1, wherein said MIM element is formed at only one portion of said first electrode.

11. The method as claimed in claim 5, wherein an electrode in a desired shape and a picture element electrode are simultaneously formed using a self-alignment method with a photomask being disposed on the rear surface of said substrate.

12. The method as claimed in claim 1, wherein said first metal electrode is formed on one of said row and column electrodes.

13. The method as claimed in claim 6, wherein said first metal electrode is formed on one of said row and column electrodes.

14. A method of forming a MIM element on a substrate having first and second sides for use in a liquid crystal display device comprising the steps of forming a first electrode metal film in a predetermined pattern on the first side of said substrate, forming an insulator over said first electrode metal film, forming a second electrode metal film over said insulator, applying a photo resist over said second electrode metal film, and exposing said second side of said substrate to radiation, said first electrode metal film acting as a radiation mask when said radiation is applied.

15. The method as claimed in claim 14, wherein said substrate is glass.

16. The method as claimed in claim 14, wherein said first electrode metal film is formed from a metal selected from the group consisting of Al, Ni, Cr and Ta.

17. The method as claimed in claim 16, wherein the thickness of said first electrode metal film is substantially in the range of 1000 Å–1μ.

18. The method as claimed in claim 17, wherein said metal is Al having a thickness of about 2000 Å.

19. The method as claimed in claim 17, wherein said metal is Ta having a thickness substantially in the range of 3000 Å–6000 Å.

20. The method as claimed in claim 14, wherein second electrode metal film is formed from a metal selected from the group consisting of Cr, Al, and NiCr having a film thickness less than about 200 Å.

21. The method as claimed in claim 20, wherein the thickness of said second electrode metal film in less than 100 Å.

22. The method as claimed in claim 21, wherein the thickness of said second electrode metal film is substantially in the range of 40 Å–60 Å.

23. The method as claimed in claim 14, wherein said second electrode metal film serves as a picture element electrode.

24. The method as claimed in claim 23, wherein said second electrode metal film is made from a member of the group consisting of ITO, $SnO_2$ and ZnO.

25. The method as claimed in claim 24, wherein said member is ITO having a thickness substantially in the range of 100 Å–2000 Å.

26. The method as claimed in claim 25, wherein said member has a thickness substantially in the range of 200 Å–800 Å.

27. The method as claimed in claim 14, wherein said insulator is made from a member of the group consisting of $SiO_2$, $Cr_2O_5$ and $Ta_2O_5$.

* * * * *